(12) United States Patent
Friedemann et al.

(10) Patent No.: US 7,071,096 B2
(45) Date of Patent: Jul. 4, 2006

(54) METHOD OF FORMING A CONDUCTIVE BARRIER LAYER WITHIN CRITICAL OPENINGS BY A FINAL DEPOSITION STEP AFTER A RE-SPUTTER DEPOSITION

(75) Inventors: Michael Friedemann, Dresden (DE); Volker Kahlert, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/039,103

(22) Filed: Jan. 20, 2005

(65) Prior Publication Data

US 2005/0233582 A1    Oct. 20, 2005

(30) Foreign Application Priority Data

Mar. 31, 2004   (DE)   ............... 10 2004 015 862

(51) Int. Cl.
*H01L 21/4763*   (2006.01)
(52) U.S. Cl. .............. 438/627; 438/643; 438/648; 438/653; 438/683; 257/E21.169
(58) Field of Classification Search ............ 438/627, 438/648, 653, 683, FOR. 369, 643; 257/E21.169
See application file for complete search history.

(56) References Cited

U.S. PATENT DOCUMENTS

| | | | |
|---|---|---|---|
| 6,764,940 B1* | 7/2004 | Rozbicki et al. | ............ 438/627 |
| 6,841,468 B1* | 1/2005 | Friedemann et al. | ........ 438/627 |
| 6,942,262 B1 | 9/2005 | Glasgow et al. | ............ 438/637 |
| 2003/0203615 A1* | 10/2003 | Denning et al. | ............ 438/627 |
| 2004/0137714 A1* | 7/2004 | Friedemann et al. | ........ 438/627 |
| 2005/0093155 A1* | 5/2005 | Kahlert et al. | .............. 257/751 |

FOREIGN PATENT DOCUMENTS

| | | |
|---|---|---|
| EP | 0 735 577 A2 | 10/1996 |
| WO | WO 02/091461 A2 | 11/2002 |

* cited by examiner

*Primary Examiner*—Michelle Estrada
(74) *Attorney, Agent, or Firm*—Williams, Morgan & Amerson, P.C.

(57) ABSTRACT

In forming a thin conductive layer in an interconnect structure by sputter deposition including a re-sputtering step, a flash deposition step is performed after the re-sputtering step to provide a sufficient layer thickness at critical locations, such as at positions of structure irregularities. The flash deposition step may be performed for a fixed process time so that less effort in process control is required while, at the same time, an increased reliability may be obtained compared to conventional approaches without a flash deposition.

27 Claims, 2 Drawing Sheets

METHOD OF FORMING A CONDUCTIVE BARRIER LAYER WITHIN CRITICAL OPENINGS BY A FINAL DEPOSITION STEP AFTER A RE-SPUTTER DEPOSITION

BACKGROUND OF THE INVENTION

1. Field of the Invention

The present invention generally relates to the fabrication of integrated circuits, and, more particularly, to the formation of an interconnection requiring the provision of a barrier layer between a bulk metal and a dielectric in which the interconnection is embedded.

2. Description of the Related Art

In an integrated circuit, a huge number of circuit elements, such as transistors, capacitors, resistors and the like, are formed in or on an appropriate substrate, usually in a substantially planar configuration. Due to the large number of circuit elements and the required complex layout of many modern integrated circuits, generally, the electrical connection of the individual circuit elements may not be established within the same level on which the circuit elements are manufactured, but such electrical connections may be established in one or more additional "wiring" layers, also referred to as metallization layers. These metallization layers generally include metal lines, providing the inner-level electrical connection, and also include a plurality of inter-level connections, also referred to as vias, wherein the metal lines and vias may also be commonly referred to as interconnections.

Due to the continuous shrinkage of the feature sizes of circuit elements in modern integrated circuits, the number of circuit elements for a given chip area, that is, the package density, also increases, thereby usually requiring an even larger increase in the number of electrical interconnections to provide the desired circuit functionality. Therefore, the number of stacked metallization layers may increase as the number of circuit elements per chip area becomes larger. Since the fabrication of a plurality of metallization layers entails extremely challenging issues to be solved, such as mechanical, thermal and electrical reliability of up to twelve stacked metallization layers that are required, for example, for sophisticated aluminum-based microprocessors, semiconductor manufacturers are increasingly replacing the well-known metallization metal aluminum by a metal that allows higher current densities and hence allows reduction of the dimensions of the interconnections and thus the number of metallization layers. For example, copper is a metal generally considered to be a viable candidate for replacing aluminum due to its superior characteristics in view of higher resistance against electromigration and significantly lower electrical resistivity when compared with aluminum.

In spite of these advantages, copper also exhibits a number of disadvantages regarding the processing and handling of copper in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures. In manufacturing metallization layers including copper, the so-called damascene technique is therefore preferably used wherein a dielectric layer is first blanket-deposited and then patterned to define trenches and vias, which are subsequently filled with copper. A further major drawback of copper is its property to readily diffuse in silicon dioxide and other low-k dielectrics.

It is therefore necessary to employ a so-called barrier material in combination with a copper-based metallization to substantially reduce diffusion of copper into the surrounding dielectric material, as copper may readily migrate to sensitive semiconductor areas, thereby significantly changing the characteristics thereof. The barrier material provided between the copper and the dielectric material should, however, in addition to the required barrier characteristics, exhibit good adhesion to the dielectric material as well as to the copper and should also have as low an electrical resistance as possible so as to not unduly compromise the electrical properties of the interconnection. In typical copper-based applications, tantalum and tantalum nitride, alone or in combination, as well as titanium and titanium nitride, alone or in combination, may successfully be employed as barrier layers. However, any other barrier layer schemes may be used as long as the required electrical, diffusion hindering and adhesion characteristics are obtained.

Irrespective of the material used for the barrier layer, with steadily decreasing feature sizes, process engineers are increasingly confronted with the challenging task to deposit an extremely thin barrier layer within trenches and vias having significantly high aspect ratios of approximately 5 or more for a trench width or a via diameter of about 0.2 μm and even less. The thickness of the barrier layer has to be chosen as thin as possible to not unduly consume space that would otherwise be occupied by the interconnection that should be filled with the more conductive copper, yet reliably suppressing or preventing the diffusion of the copper into the neighboring dielectric. The deposition of the barrier material within high aspect ratio vias, especially on sidewalls of lower portions of the vias, requires improved techniques for physical vapor deposition (PVD) processes. PVD processes are frequently used in depositing conductive materials on a substrate because of the enhanced directionality of the target atoms sputtered off an appropriate target, which is useful in directing target atoms to the bottom of the vias.

For example, in "Thin, High Atomic Weight Refractory Film Deposition for Diffusion Barrier, Adhesion Layer and Seed Layer Applications," by Rossnagel et al., *J. Vac. Sci. Technol.*, May/June 1996, a method is disclosed to deposit tantalum atoms on steep via and trench sidewalls by employing conventional non-collimated sputter deposition at very low pressures to achieve the improved directionality of the tantalum atoms.

In U.S. Pat. No. 6,306,732 to Brown, a method is suggested for improving the directionality of the target atoms, wherein an ionized PVD (IPVD) process is employed in combination with a subsequent re-sputtering step. In the ionized sputter process, a specified fraction of the target atoms (and of carrier and precursor gases if provided) is ionized by any appropriate means and a bias voltage is established between the ionized atoms and the substrate to guide the atoms to the substrate, wherein a distance between the target and substrate may be increased compared to conventional sputter tools. Due to the improved directionality of the target atoms, the bottom coverage of even very narrow and deep vias is excellent, whereas the sidewall coverage, especially in the vicinity of the bottom corners, is poor. The subsequent re-sputter step allows removal of a fraction or substantially all of the material formed on the bottom and to redistribute the material preferably at the lower sidewall portions.

Although these methods show a significant improvement over standard sputter processes, the former method suffers from a reduced barrier layer thickness at the sidewalls of the via, requiring an unduly long deposition time, thereby creating a disproportional thickness at the bottom thereof, while the latter method exhibits a remarkable sensitivity to even small variations in the structure of the via or trench. For instance, varying dimensions, different sidewall angles or, in worst-case structure irregularities, such as fencing at the via opening, minor protrusions within the trench and via, and the like may lead to reduced and thus insufficient coverage at certain portions within the trench and/or via.

In view of the above-identified difficulties encountered by the known methods, a need exists for an enhanced technique that enables material deposition on the basis of re-sputter techniques while preventing or at least reducing one or more of the above-identified problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to an improved deposition technique for forming a thin conductive layer in an interconnect structure by sputter deposition, wherein re-sputter techniques are used. After a re-sputter step, a short deposition step is performed to compensate for structural variations in the interconnect structure.

According to one illustrative embodiment of the present invention, a method comprises sputter depositing a layer of conductive material within an opening formed in a dielectric layer located on a substrate. A portion of the conductive material deposited within the opening is then re-sputtered. Moreover, additional portions of the conductive material are then deposited within the opening.

According to still another illustrative embodiment of the present invention, a method of controlling a degree of coverage of an interconnect structure is provided. The method comprises providing a substrate having formed therein at least one interconnect structure including vias and trenches and forming a layer of conductive material above the interconnect structure by a re-sputter deposition technique. The conductive material is then sputter deposited in a final flash based on at least one specified process parameter, and a thickness of the conductive material is determined at a critical position in the interconnect structure. Furthermore, a desired value of the at least one specified process parameter is determined on the basis of the determined thickness. Finally, a layer of the conductive material is formed on one or more substrates while using the desired value in the final flash of the sputter deposition.

In yet another illustrative embodiment of the present invention, a method of sputter depositing a conductive material over an interconnect structure is provided. The method comprises sputter depositing a first layer of the conductive material. Then, a sequence including re-sputtering a portion of the conductive material and depositing additional portions of the conductive material is performed as an intermediate sequence.

BRIEF DESCRIPTION OF THE DRAWINGS

The invention may be understood by reference to the following description taken in conjunction with the accompanying drawings, in which like reference numerals identify like elements, and in which.

Figure 1A:
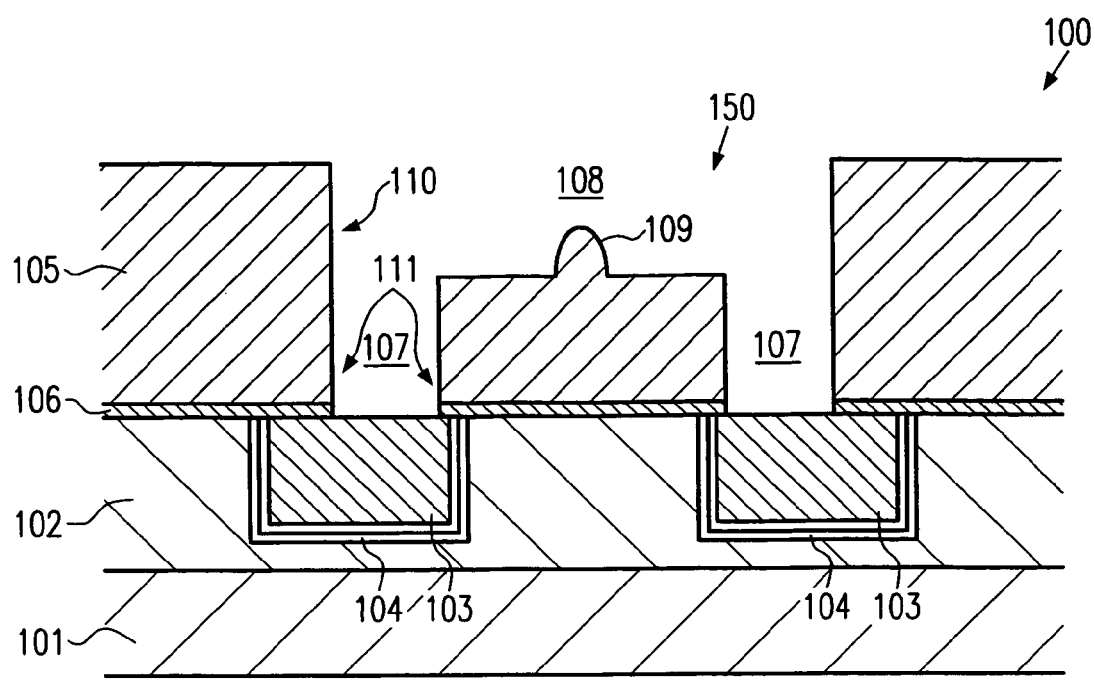
FIGS. 1a–1d schematically show cross-sectional views of a metallization structure during various manufacturing stages according to illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention provides various methods that combine enhanced manufacturability and reliability with sophisticated sputter methods including a re-sputtering step. Sputter deposition in combination with re-sputtering is presently considered a promising approach for extending sputter technology to the fabrication of interconnect structures including trenches and vias of high aspect ratios, wherein thin barrier and/or seed layers of a conductive material have to be reliably formed on sidewalls of the trenches and vias. However, sputter deposition techniques including a re-sputter step may require high efforts with respect to process control and sputter equipment, since even subtle variations of the interconnect structure may affect the resulting coverage of the sidewalls and other surfaces that need to be coated with the conductive material, thereby requiring precise process control. By introducing a subsequent short deposition step, which is also referred to as a flash deposition step and which differs at least in one process parameter setting from the preceding re-sputter process, a sufficient degree of coverage may be established even at critical areas, which have been punched through or otherwise negatively affected by the preceding re-sputter step. In particular embodiments, the final flash deposition is performed for a fixed time period, thereby significantly reducing the amount of process control required.

In the following illustrative embodiments, a barrier layer on the basis of tantalum and/or tantalum nitride is referred to since these materials currently appear to be the most promising candidates for manufacturing copper-based metallization layers including sophisticated interconnect structures. The principles of the present invention may, however, be applied to other barrier materials, such as titanium/titanium nitride based barrier layers, or barrier layers requiring the incorporation of three or more components when device requirements may necessitate barrier and adhesion characteristics other than those provided by a tantalum/tantalum nitride based barrier layer. Furthermore, the term "interconnect structure" as used herein is to be understood to include any conductive wiring structure. For instance, contact portions connecting a transistor region to a metal line may also be referred to as interconnect structures. The present invention may also be applied to any sputter process, including a re-sputter process, in which a conductive material is to be reliably deposited into an opening, irrespective of the material used. In particular embodiments, a process including the sputter/re-sputter/flash deposition sequence of the present invention may also be practiced when forming a copper seed layer above an interconnect structure prior to the deposition of the bulk metal. Moreover, although the present invention is especially advantageous when applied to copper based metallization layers, often including low-k dielectric materials instead of the well-established silicon dioxide/silicon nitride layer stack, other metals in combination with any suitable dielectric materials may be used if appropriate for specified applications. Furthermore, the interconnect structures shown and described herein are of illustrative nature only and may take any form and shape as appropriate in modern integrated circuits having openings in the form of vias and trenches with an aspect ratio of approximately 5 and higher. Thus, the present invention should not be considered as limited to any particular embodiment disclosed herein unless such limitations are expressly set forth in the appended claims.

With reference to FIGS. 1a–1d, further illustrative embodiments of the present invention will now be described. In FIG. 1a, a semiconductor structure 100, here presented in the form of a dual damascene metallization structure, comprises a substrate 101 that may include various material layers (not shown) as well as circuit elements (not shown) to at least some of which an electrical connection may be created by interconnects to be formed in the semiconductor structure 100. For a highly sophisticated semiconductor structure 100, the substrate 101 may have formed thereon an insulating layer 102, comprised of a low-k dielectric material, that is, a material having a low permittivity, such as silicon carbide hydroxide (SiCOH), and the like. Metal regions 103 are formed in the insulating layer 102, wherein, depending on the type of material of the insulating layer 102 and on the type of metal in the metal regions 103, one or more barrier layers, commonly referred to as 104, may be provided. For example, the barrier layer 104 may comprise tantalum and/or tantalum nitride when the metal regions 103 comprise copper, since presently tantalum and tantalum nitride are considered the most promising candidates for an effective barrier and adhesion layer in copper-based metallization layers. The barrier layer 104 may be a single layer of material or it may have a dual layer construction, as depicted in FIG. 1a. A second insulating layer 105 is formed above the insulating layer 102 and above the metal regions 103, wherein, typically, a thin dielectric etch stop and barrier layer 106 is provided between the insulating layers 102 and 105. For example, the second insulating layer 105 may be comprised of SiCOH and the etch stop layer 106 may be comprised of nitrogen-containing silicon carbide. However, other material compositions may be used. For example, in devices with less critical requirements with regard to signal propagation delay owing to a high coupling capacitance of neighboring metal regions, the second insulating layer 105 and the etch stop layer 106 may be comprised of silicon dioxide and silicon nitride, respectively. Via openings 107 and a trench opening 108 are formed in the second insulating layer 105 and the etch stop layer 106 and may commonly be denoted as an interconnect structure 150. A width of the trench 108 may range from approximately 0.2–2 µm in sophisticated devices, and the diameter of the via openings 107 may range from approximately 0.1 µm or less to 0.3 µm, wherein a depth of the via openings 107 may range from approximately 0.5–1.5 µm or even more. Thus, the aspect ratio of the via openings 107 may be approximately 5 or more.

It should be noted that the principles of the present invention may be applied to semiconductor structures having trenches and openings in the above specified ranges. However, any other device dimensions may also be suitable in practicing the present invention. In particular, the trench and via openings 108, 107 are of illustrative nature only, and typically the semiconductor structure 100 may also include closely spaced trenches and vias and/or isolated trenches and vias as well as vias without a surrounding trench. All of these structural variations should be considered included by the interconnect structure 150.

The via and trench openings 107, 108 comprise an upper portion 110 and a lower portion 111, wherein the upper portion 110 includes the sidewall of the trench opening 108 and the lower portion 111 includes the bottom of the via openings 107 and the sidewalls adjacent to the bottom of the via openings 107. Especially the lower portion 111 may be difficult to be reliably covered by a barrier layer or a seed layer based on sputter deposition techniques without a re-sputtering step as will be discussed in more detail below. The trench opening 108 may have formed at its bottom a protrusion 109 owing to process specific variations as will be discussed later on. The protrusion 109 may represent any typical variation in structure of modern integrated semiconductor devices and such structural variations may put at risk the device reliability if not appropriately accounted for in subsequent processes, such as the formation of a barrier layer reliably covering the entire surface of the dielectric layer 105. As previously noted, especially structural variations, such as the protrusion 109 that may form in various configurations depending on process variations and structural specifics, may not sufficiently be covered by the deposition and re-sputter method previously described.

A typical process flow for forming the semiconductor structure 100 as depicted in FIG. 1a may include the following processes. After the formation of the insulating layer 102 by well-established deposition techniques, such as plasma enhanced chemical vapor deposition (PECVD), the metal regions 103 may be formed by etch, deposition and plating processes that are similar to those described in the following with reference to the second insulating layer 105 and the via and trench openings 107, 108. Consequently, a description of these steps is omitted here. Thereafter, the etch stop/barrier layer 106 and the second insulating layer 105 are formed by an appropriate formation technique, such as PECVD for silicon carbide and SiCOH, or silicon nitride and silicon dioxide, respectively. In other embodiments, a low-k material may be used for the insulating layer 105 and may be applied by spin-coating. Next, a photolithography step is performed including the application of an anti-reflective coating (ARC) and a resist layer (both layers not shown) followed by exposure and development of the resist layer. Subsequently, openings are etched into an upper portion of the insulating layer 105 according to the damascene regime used. For instance, the via openings 107 may be defined first and, in a subsequent photolithography step, the trench opening 108 is formed along with the via openings 107 in the lower portion of the insulating layer 105. However, other photolithography and etch schemes may be employed. The protrusion 109 may be formed during the trench etch process owing to, for example, incomplete resist development caused by nitrogen compounds diffusing within the low-k material of the insulating layer 105, also referred to as resist poisoning, and the like. The presence of structure imperfections such as the protrusion 109 may significantly depend on the materials used, the dimensions of openings 107, 108, process variations, and the like, and may place a burden on the subsequent deposition process for forming a conductive barrier layer on all exposed dielectric surfaces without requiring an undue excess thickness to provide the minimum required thickness at critical areas, such as the lower portions 111 and the protrusion 109.

Figure 1B:
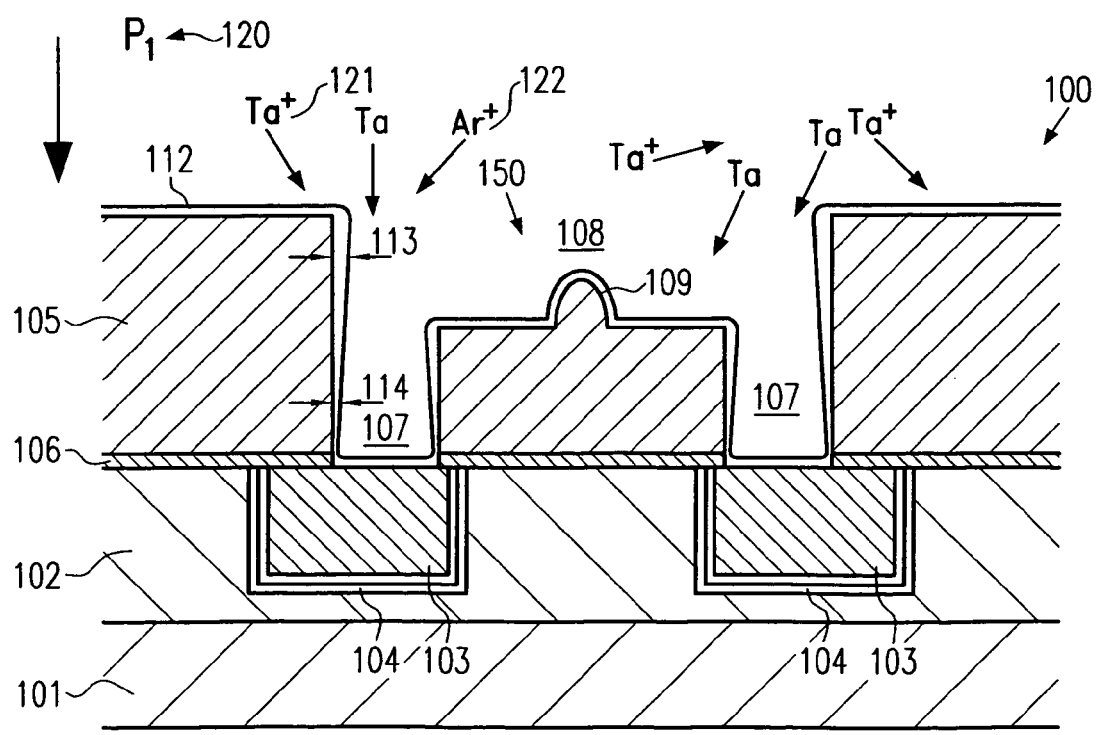

FIG. 1*b* schematically depicts the semiconductor structure 100 exposed to a deposition ambient 120. The deposition ambient 120 is meant to include all parameters that affect a sputter deposition of a conductive material on the semiconductor structure 100. Thus, the deposition ambient 120 represents a gaseous ambient comprising target atoms and ions 121 and carrier gas atoms and ions 122, which are provided at a specified pressure, indicated by P1. Moreover, a bias voltage, indicated by V1 (not on FIG. 1B), may be established in the deposition ambient 120 by supplying a corresponding bias power to the deposition ambient 120.

Moreover, the deposition ambient 120 is to represent any specifics of a deposition tool used for establishing the deposition atmosphere in the ambient 120. For instance, the geometry and the design of the process chamber may represent a part of the ambient 120. In principle, any sputter deposition tool may be used that is configured to perform a re-sputter process. For example, many of the presently available sputter tools include an induction coil that may be energized to produce ions without requiring a voltage applied to the sputter target. The ionized fraction of the carrier gas may then be drawn towards the substrate by applying a negative voltage to a pedestal supporting the substrate, thereby generating an ion bombardment at the substrate. The power supplied to the pedestal and the corresponding counter electrode, which is required to establish the voltage drop towards the pedestal, is referred to as bias power. The ions hitting the substrate may sputter off atoms from surface areas exposed to the ion bombardment similarly as is the case on the sputter target when energized to create and attract carrier gas ions. The degree of the re-sputtering effect achieved on the substrate surface may depend on the pressure, i.e., the mean free path length of the ions traveling to the substrate surface, the distance of the coil to the substrate, the type of material used and the like, and, of course, as previously explained, pattern-specific characteristics. Illustrative methods and apparatus for performing such a re-sputter process are described in U.S. Pat. No. 6,498,091 by Chen et al., the contents of which is herewith incorporated by reference. Other appropriate sputter tools include Applied Materials IMP, SIP and EnCoRe reactors and Novellus HCM reactors.

The parameters defining the deposition ambient 120 in FIG. 1*b*, especially the values of the pressure P1 and the values for the bias power to adjust the bias voltage V1, represent an initial state of the deposition ambient 120 for a given tool geometry and design. In one embodiment, the deposition ambient 120 may comprise tantalum in atomic and ionic form as the target material, i.e., as the material to be deposited, and argon in atomic and ionic form as an inert material required to liberate the target atoms from an appropriate sputter target (not shown). Due to the kinetics within the deposition ambient 120, atoms and ions of the inert material may also be deposited to a certain amount on the semiconductor structure 100.

In other embodiments, the deposition ambient 120 may additionally include nitrogen atoms and ions (not shown), at least temporarily, to deposit a metal nitride compound continuously, or intermittently or temporarily, by correspondingly feeding the nitrogen to the deposition ambient 120. In other embodiments, the deposition ambient 120 may comprise titanium ions and atoms, and in still a further variant, additionally nitrogen may be present continuously, intermittently or temporarily. When a copper seed layer is to be deposited, a corresponding copper target may be used. However, any other conductive material may be used that is suitable for forming a conductive layer above the interconnect structure 150.

In one embodiment, an EnCoRe reactor from Applied Material is used with a target power of approximately 20 kW, a coil power of approximately 0 kW, a pressure of approximately 1 milliTorr and a bias power of approximately 150 W for the deposition of tantalum. For other sputter deposition tools and materials, corresponding parameter settings may readily be established based on commonly used process recipes and/or test runs.

The ratio of ionized particles to atomic particles in the deposition ambient 120 may be determined by an ionizing power or a plasma generating power supplied to the deposition ambient 120, that is, to the target, and may range from approximately 1–40%. In one embodiment, a plasma generating power of approximately 15–25 kilowatts may be appropriate to provide a desired atom and ion density within the deposition ambient 120 for commonly used sputter deposition tools. The deposition ambient 120 may be established and confined by any appropriate sputter deposition tool capable of performing an ionized sputter deposition process.

FIG. 1*b* further shows a barrier layer 112 substantially comprised of the materials present in the deposition atmosphere 120, wherein the amount of the inert component 122, such as the argon, is typically significantly less than the amount of the target and/or additional component due to the sputter specific kinetics in the deposition ambient 120. A thickness of the barrier layer 112 at the upper portion 110, indicated as 113, exceeds the thickness at the lower portion 111, indicated as 114, due to the parameter setting defining the initial state of the deposition ambient 120.

A typical process flow for forming the barrier layer 112 and for establishing the deposition ambient 120 with its initial state may include the following steps. First, the substrate is inserted in an appropriate sputter tool (not shown) including a solid target material, for example, in the form of an electrode plate. By feeding an inert carrier gas, such as argon, and supplying electric power, such as DC power, to the portion of the tool in the vicinity of the sputter target, a plasma is established, causing a bombardment of charged particles, which in turn release target atoms from the sputter target. The pressure P1 is adjusted by controlling a flow rate of the inert carrier gas and the discharge of gaseous components from the sputter tool. By supplying a bias power to the deposition ambient 120, i.e., a DC voltage is applied between the target and the semiconductor structure 100, a fraction of the target atoms and a typically smaller fraction of the inert gas, due to the higher ionization potential of the inert gas, may be ionized and accelerated towards the structure 100 in more directional manner than the remaining non-ionized particles. In other sputter tools, the fraction of ionized target and inert gas atoms may be determined by the power supplied to the induction coil, and the bias power creating the bias voltage V1 substantially determines the acceleration of the charged particles towards the structure 100, thereby determining the general directionality of the particles. The trajectories of the particles moving towards the structure also depend on the distance of the sputter target from the structure 100 and the pressure P1, as these quantities mainly affect the number of scatter events that a particle experiences on its way to the structure 100. Thus, for a given distance, the directionality may also be influenced by the pressure in the deposition ambient 120. With the above specified values for the pressure P1 and the bias power causing the bias voltage V1 with a distance of approximately 20–40 cm as commonly provided in available ionizing sputter tools, the target atoms and ions 121 moving towards the structure 100 are predominantly deposited on horizontal portions and on the upper portions 110, wherein the composition of the barrier layer 112 depends on the target material and the additional precursors fed to the deposition ambient 120.

Figure 1C:
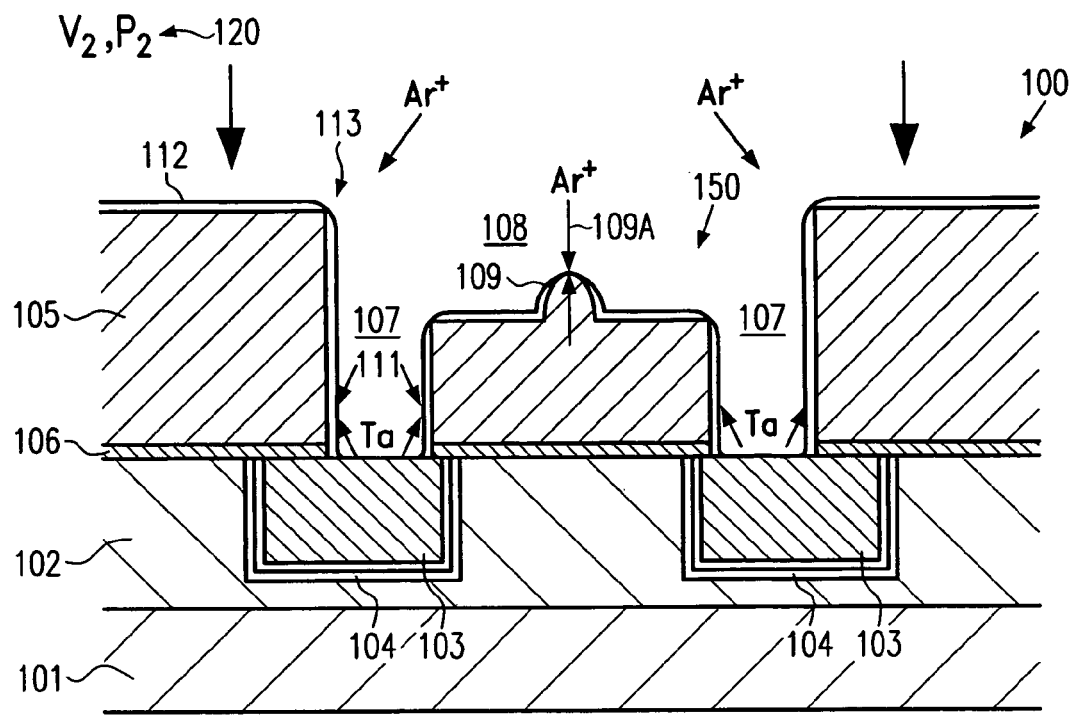

FIG. 1c schematically illustrates the structure 100 when exposed to the deposition ambient 120 being in an advanced state defined by a second pressure P2 and a second bias voltage V2, to re-sputter material from the layer 112 and re-deposit the material at the lower portions 111. Typically, the second bias voltage V2 is higher than the first bias voltage V1. The motion of the target ions 121 and of the ionized inert gas 122 is generally more directional due to the increased bias voltage V2, that is, a greater amount of the ionized particles move under the control of the increased bias voltage V2 compared to the first state of the deposition ambient 120 shown in FIG. 1a. In order to obtain a wider distribution of the ions generally moving towards the lower portion 111, in some embodiments, the pressure P2 may be increased compared to the pressure P1 to increase the number of scatter events especially occurring within the "fine" structure formed by the via openings 107, thereby achieving a deposition of target material preferably at the lower portions 111. Without restricting the present invention thereto, it is believed that the mean free path length of the particles during these small scale scatter events is of the order of the structural dimensions of via openings 107, thereby resulting in an enhanced deposition rate at the lower portion 111. Although this re-sputtering process is advantageous with respect to an enhanced coverage of the lower portions 111, other critical locations such as corner areas 113 or the protrusion 109 may be affected differently by the re-sputter process and may create a less reliable layer thickness as indicated, for instance, for the protrusion 109 as 109a.

Hence, a flash deposition step is introduced during which the layer thickness is sufficiently increased at critical locations, such as the protrusion 109, wherein at least one process parameter is changed with respect to the preceding re-sputtering process. In one particular embodiment, at least the bias power supplied to the deposition ambient 120 is decreased to effect a more isotropic motion of the ionized particles drifting towards the substrate 101. When the fraction of ionized particles within the deposition ambient 120 is lowered during the re-sputtering process, for instance by de-energizing the sputter target or by decreasing the power supplied thereto, the amount of ionized and neutral target particles may be correspondingly increased by selecting an appropriate target power. In some embodiments, substantially the same parameter settings as in the first state represented by V1 and P1 of the deposition ambient 120 may be re-established to deposit a sufficient layer thickness at the critical locations. In other embodiments, other parameter settings may be selected as long as at least one process parameter differs in its value during the flash deposition step from the setting used in the preceding re-sputtering process. In one illustrative embodiment, when tantalum is to be deposited by means of the above-mentioned Applied Material reactor, the target power may be reduced during the re-sputtering step to approximately 0.2 kW, while the coil power is set to approximately 1 kW to provide sufficient carrier gas ions in the deposition ambient 120. The pressure P2 may be adjusted to approximately 4 milliTorr, while the bias power is set to approximately 500 Watts. Thereafter, in the final flash deposition step, the parameter setting may be re-established to that of the initial setting represented by V1 and P1 in FIG. 1b. That is, the target power may be adjusted to approximately 20 kilowatts, while the coil power is again reduced to approximately 0 with the pressure being at approximately 1 milliTorr with a bias power of approximately 150 Watts.

In one particular embodiment, the flash deposition step is performed for a fixed time period, for instance, for a time period in the range of approximately 1–5 seconds. Advantageously, the flash deposition may be performed without any further process control, thereby significantly relaxing control requirements with respect to endpoint detection for a reliable coverage. In other embodiments, the parameter settings of the final flash deposition step may be selected in advance in accordance with process or device requirements. For instance, the process parameters during the final flash deposition step may be selected to obtain a specified deposition rate. A corresponding set of parameter values may be obtained by test runs and subsequent thickness measurements, wherein, based on the measurement results, an appropriate deposition time may then be selected. Advantageously, the parameter values may be determined such that a deposition time during the flash deposition step in the range of approximately 1–5 seconds results in a layer thickness of approximately 10–60 Å (1–6 nm). In other embodiments, the parameter setting may be established in view of reducing a non-uniformity of the finally obtained layer 112. That is, the ratio of atomic and ionized particles within the deposition ambient 120, the pressure, the bias power, and the like, may be selected such that a deposition preferably occurs at the critical locations that have previously experienced an extensive non-desired material removal during the re-sputtering. Again, a corresponding set of parameter values may be established on the basis of test runs. For instance, one or more substrates 101 having formed thereon an interconnect structure substantially similar to that of the structure 150 represented by the trench 108 and the via openings 107 may be subjected to one or more deposition sequences including a first deposition step, a re-sputtering step and a final flash deposition step, wherein at least one parameter during the final flash deposition step may be varied. Thereafter, the resulting layer thickness at one or more critical locations may be determined, for instance, by electron microscopy, and may be related to the at least one process parameter. Based on this correlation, other product substrates may be processed while using a desired value for the at least one process parameter, wherein the desired value is established on the basis of the correlation.

Figure 1D:
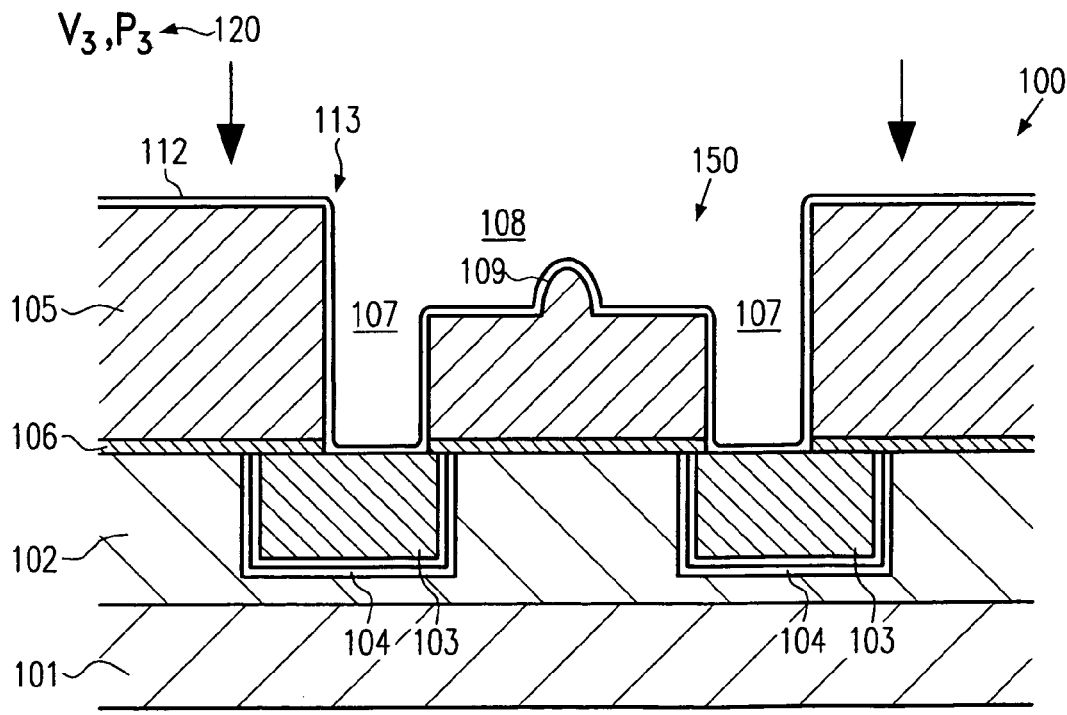

FIG. 1*d* schematically shows the semiconductor structure 100 after completion of the final flash deposition step. As shown, the thickness of the layer 112 may be significantly increased at the critical locations, such as the corner portions 113 and the protrusion 109. Thus, a high degree of reliability of the resulting interconnect structure 150 defined by the trench 108 and the via openings 107 may be obtained by means of the final flash deposition step, wherein the effort for control strategies and deposition and metrology equipment is significantly less compared to a conventional approach without a final flash deposition step.

As previously explained, the above-described process sequence including at least a deposition/re-sputtering/flash deposition step may be applied to any material deposition requiring a reliable coverage of sidewalls of a contact or interconnect opening, irrespective of the material used. Hence, the above-described sequence may also be applied to the formation of a seed layer as is typically provided in a copper damascene process to create a current distribution layer and/or an efficient catalyst layer for a subsequent electrochemical deposition of bulk copper. Since a non-sufficient layer thickness of the seed layer may result in corresponding irregularities during the electrochemical deposition, it is also of great importance to provide a sufficient copper seed layer thickness at any critical location, such as the protrusion 109. For the sputter deposition of the copper seed layer, substantially the same criteria apply as previously pointed out with reference to the deposition of tantalum. In one illustrative embodiment using the above-identified reactor from Applied Materials, a copper seed layer may be deposited with the following parameter settings:

Deposition: target power approximately 38 kW, pressure approximately 1 milliTorr, bias power approximately 300 W;
Re-sputtering: target power approximately 38 kW, pressure approximately 1 milliTorr, bias power approximately 900 W; and
Flash deposition: target power approximately 38 kW, pressure approximately 1 milliTorr, bias power approximately 300 Watts.

However, other process parameter settings may be established on the basis of the above-described considerations.

In the illustrative embodiments described so far, a single re-sputtering process and a final flash deposition step is performed during the deposition of a specified conductive layer above an interconnect structure. In other embodiments, a sequence of deposition steps and re-sputtering steps may be performed wherein, advantageously, a first deposition step is carried out for an increased period of time, and whereby subsequent deposition steps may have the character of "flash" type deposition steps interrupted by corresponding re-sputtering processes. For instance, an initial deposition step may provide a sufficient layer thickness, and thereafter a first re-sputtering process and a first flash deposition step may be performed to redistribute material and "recover" the layer thickness at critical locations during the first flash deposition. Thereafter, a second re-sputtering process may be performed, possibly followed by a further flash deposition step. In this way, the effect of the re-sputter process may be "smoothed" at the critical locations. Although it may be advantageous that the final process step in such a process sequence is a flash deposition step, in some embodiments, it may be sufficient to introduce at least one flash deposition step between two re-sputtering steps to substantially avoid any punch-through or extensive material removal at critical locations. Regarding the parameter settings during the one or more re-sputtering processes and the flash deposition steps, the same criteria apply as previously explained. In some embodiments, the parameter setting during the individual re-sputter and/or flash deposition processes may be varied or different process times may be used.

As a result, the present invention provides an improved sputter deposition technique that allows an enhanced manufacturability and reliability at moderate control complexity and reduced hardware requirements. The introduction of at least one timely limited deposition step after a preceding re-sputtering step may significantly reduce the influence of structural variations of an interconnect structure on the finally obtained barrier and seed layers. Thus, the sputter technique may be extended to future device generations with either no or only a moderate increase in process complexity and hardware requirements.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   sputter depositing a layer of conductive material within an opening formed in a dielectric layer;
   re-sputtering a portion of said conductive material deposited within said opening;
   sputter depositing additional portions of said conductive material within said opening; and
   performing at least one additional re-sputtering process after the process of sputter depositing said additional portions of said conductive material within said opening.

2. The method of claim 1, wherein sputter depositing additional portions of said conductive material is performed for a predefined time period.

3. The method of claim 2, wherein said predefined time period ranges from approximately 1–5 seconds.

4. The method of claim 1, wherein re-sputtering a portion of said conductive material is performed in a sputter ambient of a first state and sputter depositing said additional portions of said conductive material is performed in said sputter ambient being in a second state, a bias power of said second state being lower than a bias power of said first state.

5. The method of claim 4, wherein a pressure in said sputter ambient in the first state is higher than a pressure of said second state.

6. The method of claim 1, further comprising controlling at least one process parameter of a sputter ambient during the sputter deposition of said additional portions of said conductive material to adjust a deposition non-uniformity of said conductive material in said opening.

7. The method of claim 1, further comprising controlling at least one process parameter of a sputter ambient during the sputter deposition of said additional portions of said conductive material to adjust a deposition rate for depositing said additional portions of said conductive material.

8. The method of claim 1, wherein said conductive material comprises at least one of tantalum and tantalum nitride.

9. The method of claim 1, wherein said conductive material comprises copper.

10. The method of claim 1, wherein process parameters for sputter depositing said conductive material are substantially the same as for sputter depositing said additional portions of said conductive material.

11. A method of controlling a degree of coverage of an interconnect structure, the method comprising:
    providing a substrate having formed therein at least one interconnect structure including vias and trenches;
    forming a layer of conductive material above said interconnect structure by a re-sputter deposition technique;
    sputter depositing said conductive material in a final flash based on at least one specified process parameter;
    determining a thickness of said conductive material at a critical position in said interconnect structure;
    determining a desired value of said at least one specified process parameter on the basis of said determined thickness; and
    forming a layer of said conductive material on one or more substrates while using said desired value in said final flash of sputter deposition.

12. The method of claim 11, wherein said thickness of said conductive material is determined on the basis of a plurality of different parameter settings of said at least one specified process parameter.

13. The method of claim 11, wherein said at least one specified process parameter represents at least one of a bias power, a pressure of a deposition ambient during said final flash and a deposition time of said final flash.

14. A method, comprising:
    sputter depositing a layer of conductive material within an opening formed in a dielectric layer;
    re-sputtering with a first bias power a portion of said conductive material deposited within said opening;
    sputter depositing additional portions of said conductive material within said opening with a second bias power for a fixed deposition time, said second bias power being less than said first bias power; and
    performing at least one additional re-sputtenng process after the process of sputter depositing said additional portions of said conductive material within said opening.

15. The method of claim 14, wherein said fixed deposition time is in the range of approximately 1–5 seconds.

16. The method of claim 14, wherein a pressure during sputter depositing said additional portions is equal to or lower than a pressure during re-sputtering a portion of said conductive material.

17. The method of claim 14, further comprising controlling at least one process parameter of a sputter ambient during the sputter deposition of said additional portions to adjust a deposition non-uniformity of said conductive material in said opening.

18. The method of claim 14, further comprising controlling at least one process parameter of a sputter ambient during the sputter deposition of said additional portions to adjust a deposition rate for depositing said additional portions.

19. The method of claim 14, wherein said conductive material comprises at least one of tantalum and tantalum nitride.

20. The method of claim 14, wherein said conductive material comprises copper.

21. The method of claim 14, wherein process parameters for sputter depositing said conductive material are substantially the same as for sputter depositing said additional portions.

22. A method of sputter depositing a conductive material over an interconnect structure, the method comprising:
    sputter depositing a first layer of said conductive material;
    performing a sequence including re-sputtering a portion of said conductive material and depositing a second layer of said conductive material, said sequence being a non-final sequence of sputter depositing said conductive material; and
    performing a second sequence including re-sputtering a portion of said second layer of said conductive material and depositing a further layer of said conductive material.

23. The method of claim 22, further comprising performing at least one re-sputter process after performing said sequence.

24. The method of claim 22, wherein depositing of said second layer during said sequence is performed for a predefined time period.

25. The method of claim 24, wherein said predefined time period is in the range of approximately 1–5 seconds.

26. The method of claim 22, wherein a pressure during depositing said second layer is equal to or lower than a pressure during re-sputtering a portion of said conductive material.

27. The method of claim 22, wherein a bias power supplied to a deposition ambient during depositing said second layer is lower than a bias power supplied during re-sputtering a portion of said conductive material.

* * * * *

UNITED STATES PATENT AND TRADEMARK OFFICE
CERTIFICATE OF CORRECTION

PATENT NO. : 7,071,096 B2
APPLICATION NO. : 11/039103
DATED : July 14, 2006
INVENTOR(S) : Michael Friedemann and Volker Kahlert It is certified that error appears in the above-identified patent and that said Letters Patent is hereby corrected as shown below:

Col. 13, line 58 (claim 14, line 10), change "re-sputtenng" to -- re-sputtering --.

Signed and Sealed this

Twenty-ninth Day of August, 2006

JON W. DUDAS
*Director of the United States Patent and Trademark Office*

UNITED STATES PATENT AND TRADEMARK OFFICE
CERTIFICATE OF CORRECTION

PATENT NO.       : 7,071,096 B2                                              Page 1 of 1
APPLICATION NO.  : 11/039103
DATED            : July 4, 2006
INVENTOR(S)      : Michael Friedemann and Volker Kahlert It is certified that error appears in the above-identified patent and that said Letters Patent is hereby corrected as shown below:

Col. 13, line 58 (claim 14, line 10), change "re-sputtenng" to -- re-sputtering --.

This certificate supersedes Certificate of Correction issued August 29, 2006.

Signed and Sealed this

Seventh Day of November, 2006

JON W. DUDAS
*Director of the United States Patent and Trademark Office*